United States Patent [19]

Djokic et al.

[11] Patent Number: 5,849,170
[45] Date of Patent: Dec. 15, 1998

[54] ELECTROLESS/ELECTROLYTIC METHODS FOR THE PREPARATION OF METALLIZED CERAMIC SUBSTRATES

[76] Inventors: Stojan Djokic, 15825 Beaumaris Road, #303, Edmonton, Alberta, Canada, T5X 5H1; Ross Lepard, 21378 TWP 550, Fort Saskatchewan, Alberta, Canada, T8L 4B9; Robert Roy, 5404 141 Street, Edmonton, Alberta, Canada, T6H 4A2

[21] Appl. No.: 492,347

[22] Filed: Jun. 19, 1995

[51] Int. Cl.$^6$ ............................................. C25D 5/54
[52] U.S. Cl. .................... 205/163; 205/176; 205/181; 205/182; 205/210; 427/309; 427/314
[58] Field of Search .................................. 205/163, 170, 205/181, 182, 205, 210, 211, 223; 427/304, 305, 309, 314; 134/16

[56] References Cited

U.S. PATENT DOCUMENTS

| | | | |
|---|---|---|---|
| 3,296,012 | 1/1967 | Stalnecker et al. | 117/47 |
| 3,690,921 | 9/1972 | Elmore et al. | 117/54 |
| 4,110,176 | 8/1978 | Creutz et al. | 205/296 |
| 4,428,986 | 1/1984 | Schachameyer | 427/309 |
| 4,574,094 | 3/1986 | DeLuca et al. | 427/96 |
| 4,701,352 | 10/1987 | De Luca et al. | 427/309 |
| 4,766,017 | 8/1988 | Heymann et al. | 427/309 |
| 4,842,899 | 6/1989 | Tsuru et al. | 427/309 |
| 5,008,157 | 4/1991 | Paxos | 428/612 |
| 5,058,799 | 10/1991 | Zsamboky | 228/124 |
| 5,100,714 | 3/1992 | Zsamboky | 428/137 |

FOREIGN PATENT DOCUMENTS

PCT/US/93/04541  11/1993  WIPO .

*Primary Examiner*—Kathryn Gorgos
*Assistant Examiner*—Kishor Mayekar
*Attorney, Agent, or Firm*—Arne I. Fors; D. Doak Horne

[57] ABSTRACT

An improved process for the preparation of metallized ceramic substrates having a metal layer ranging from ten to two hundred microns in thickness, and having enhanced adhesion strength is provided. The process involves, in combination, a novel method for conditioning the ceramic substrate and the application of a thin intermediate layer of electrolessly and optionally, electrolytically, deposited metal prior to electrolytic metal deposition of an outer metallized layer.

20 Claims, 2 Drawing Sheets

ELECTROLESS/ELECTROLYTIC METHODS FOR THE PREPARATION OF METALLIZED CERAMIC SUBSTRATES

FIELD OF THE INVENTION

The present invention relates to metallized ceramic substrates, having enhanced adhesion strength between the metal-ceramic interface and to a process for the preparation thereof. More specifically, an improved method for metallizing the ceramic substrate using electroless plating and electrodeposition techniques is provided.

BACKGROUND OF THE INVENTION

Metallized ceramic substrates find wide usage for power electronic applications, exemplary of which are high density DC/DC converters, power amplifiers, RF circuitry and high current switches. These metallized ceramic substrates take advantage of the electrical conductivities of certain metals and the good thermal conductivities, mechanical strength properties and low electrical conductivities of ceramics. Aluminum nitride metallized with copper is particularly favoured because of the relatively high oxidation resistance in combination with excellent electrical conductivity of copper and the high thermal conductivity of aluminum nitride.

A series of patents has been directed towards finding improved methods of preparing these metallized ceramic substrates by direct bonding of the metal to the ceramic. Such methods are founded upon a combination of electroless deposition and electrodeposition of the metal directly onto the substrate.

U.S. Pat. No. 3,296,012 discloses a method for electroless plating of copper onto alumina wherein the surface of the ceramic is first leached so as to provide it with a submicroscopically porous surface.

G. V. Elmore, in U.S. Pat. No. 3,690,921 describes treating the ceramic surface with molten alkali metal hydroxide prior to metal deposition using electroless and/or electrolytic metal plating techniques. Although this process provides good coverage, it has gained only limited acceptance commercially due to the low metal-ceramic bonding strength.

A method of preparing a beryllia substrate for subsequent autocatalytic deposition of a metallized film thereon is contemplated by S. S. Schachameyer in U.S. Pat. No. 4,428,986. The beryllia substrate is first immersed in a sodium hydroxide solution followed by immersion in a fluoride solution. Deleteriously, silica and magnesium are removed from the grain boundaries of the beryllia, weakening the beryllia surface and leading to very low metal-ceramic adhesion strength.

Both U.S. Pat. Nos. 5,058,799 and 5,100,714 teach methods for the metallization of ceramic substrates which include an acid etchant step with phosphoric acid. The processes are limited to the production of relatively thin films, typically less than fifteen microns. A major disadvantage of these processes resides in the necessity to use fluoroboric acid.

PCT Application (International Application Number: PCT/US93/04541) describes an aluminium nitride metallized structure. The structure comprises a substrate formed of 1) an aluminium nitride sintered body; and a metallized structure formed on said substrate comprising 1) a first layer deposited on said sintered body, said first layer comprising an alloy having the general formula $$X_xZ_{1}00-x$$

wherein X is at least one member selected from the group consisting of Ti, Zr, Hf, and the rare earth elements, Z is at least one member selected from the group consisting of Mo, W, Cr, Nb, V and Ta, and $10<x<60$ atomic %, and ii) a second layer comprising at least one of Au, Co, Cu, Ni and Fe deposited on said first layer.

Thus, to date, the prior art processes have failed to provide metallized ceramic substrates having a metal thickness layer exceeding about fifteen microns and with an adhesion strength greater than about seven to fifteen megapascals. Additionally, metallized substrates encounter serious problems associated with blistering and cracking during post thermal heat treatments.

SUMMARY OF THE INVENTION

It is a primary objective of the present invention to produce a metallized ceramic substrate having a 'thick' metal layer. By thick is meant a thickness ranging from about 10 to 200 microns It is a further objective of the invention to provide a metallized ceramic substrate having excellent metal-ceramic adhesion strength.

Additionally, it is an objective of the invention to provide a metallized ceramic substrate exhibiting a reduced tendency to blistering or cracking at higher temperatures during subsequent heat treatment processing, an ability to withstand thermal processing and furthermore to exhibit smooth surface properties.

In accordance with the present invention there is provided a process for the production of metallized ceramic substrates which comprises:

a) cleaning said ceramic substrate with an organic solvent;
b) etching said cleaned substrate using an alkaline solution;
c) heat treating said etched substrate at a temperature effective to pyrolyse residual organic impurities;
d) subjecting said heat treated substrate to a second alkaline etch to thereby remove any alkaline soluble impurities formed during said heat treatment step;
e) sensitizing the substrate surface for electroless deposition;
f) forming palladium active sites on said sensitized surface;
g) electrolessly depositing a metal selected from nickel, silver, gold, cobalt, palladium or platinum;
h) optionally, electrolytically depositing the same metal selected for step g) to thereby provide, in combination, an intermediate metal layer;
i) activating said metallized surface using a dilute mineral acid solution to remove passivating oxides and in order to subsequently produce a substantially crack free and pore free electrodeposited layer;
j) water washing said plated substrate to remove excess acid solution;
k) electrodepositing a metal or alloy platable from an aqueous solution, said metal or alloy being selected from nickel, copper, silver, gold, cobalt, palladium, platinum, or phosphorus, boron, tungsten or molybdenum alloys thereof upon said thin intermediate metal layer;
l) optionally activating said plated substrate using a dilute mineral acid wash;
m) optionally water washing the plated substrate of step l);
n) optionally repeating the electrodeposition, activation and water wash steps k), l) and m) respectively until the desired metal layer thickness is attained for the metallized ceramic substrate product.

The objectives of the invention can be met by the above-described process particularly by the provision of an intermediate thin metal layer as formed in combination by steps g) and h). Without being bound by same by thin, with regard to the intermediate layer, is meant a metal layer less than about one micron in thickness.

The ceramic substrate may be selected from aluminum nitride, alumina, beryllia, tungsten carbide, silicon carbide or zirconia, the most preferred ceramic substrate being aluminum nitride. The intermediate layer may comprise a metal selected from nickel, cobalt, silver, gold, platinum or palladium. The intermediate layer will inevitably contain trace amounts of palladium. The most preferred metal for the intermediate layer would be nickel and the preferred thickness of said layer would be about one micron. The outer metallized layer could comprise a metal or alloy selected from copper, nickel, silver, gold, platinum, or palladium, or phosphorous, boron, tungsten or molybdenum alloys thereof, more particularly Cu, Ni, Ag, Au, Pt, Pd, NiWP, NiMoP, NiWB or NiMoB. The outer layer would generally have a thickness in the range of between about 10 to 200 microns but greater thicknesses are contemplated. Generally the metal-ceramic adhesion bond strength would be at least between about 50 to 70 MPa.

In a product aspect, therefore, the invention comprises a metallized ceramic substrate which comprises: a ceramic substrate selected from aluminium nitride, alumina, beryllia, tungsten carbide, silicon carbide or zirconia; an intermediate metal layer selected from nickel, silver, gold, cobalt, palladium or platinum; and an outer layer selected from nickel, copper, silver, gold, cobalt, platinum, or phosphorus, boron, tungsten or molybdenum alloys thereof, said outer layer having a thickness in the range of about 10 to 200 microns and a metal-ceramic bond strength in the range of between about 50 to 70 megapascals. The most preferred product comprises a metallized ceramic substrate which comprises: an aluminum nitride substrate, an intermediate nickel layer and an outer layer comprising copper having a thickness in the range of about 10 to 200 microns and a copper-aluminum bond strength in the range of between about 50 to 70 megapascals.

Additionally, the priming of the substrate conducted in steps a) through to d) are necessary to effect good adhesion of the intermediate metal layer. Consequently, the invention extends to a method for conditioning a ceramic substrate, prior to metal deposition thereon by electroless/electrolytic deposition or any other known conventional metal deposition methods, such as chemical vapour deposition or physical vapour deposition. The method for priming the substrate comprises: cleaning said ceramic substrate with an organic solvent; etching said cleaned substrate using an alkaline solution; heat treating said etched substrate at a temperature effective to pyrolyse residual organic impurities; and subjecting said heat treated substrate to a second alkaline etch to thereby remove any alkaline soluble impurities formed during said heat treatment step.

In yet another aspect of the invention, because of the excellent ceramic surface preparation, a process for providing a thin-filmed metallized ceramic substrate having improved adhesion strength is provided. The adhesion strength obtained is in the range of between fifty to seventy megapascals. The method comprises: cleaning said ceramic substrate with an organic solvent; etching said cleaned substrate using an alkaline solution; heat treating said etched substrate at a temperature effective to pyrolyse residual organic impurities; subjecting said heat treated substrate to a second alkaline etch to thereby remove any alkaline soluble impurities formed during said heat treatment step; sensitizing the substrate surface for electroless deposition; forming palladium active sites on said sensitized surface; electrolessly depositing a metal selected from nickel, silver, gold, cobalt, platinum or palladium, and optionally, electrolytically depositing a metal selected from nickel, silver, gold, copper, cobalt, palladium, platinum or phosphorous, boron, tungsten, or molybdenum alloys thereof to thereby provide a thin-filmed metallized ceramic substrate.

A final aspect of the invention which contributes to reduction in blistering and cracking resides in the use of a novel electroplating bath composition. In contradistinction to conventional teachings, which maintain that addition of iron to such a plating bath is harmful, it has been determined that the addition of low concentrations of nickel and iron salts (of the order of 0.1 g/L) are functional to reduce blistering and cracking. The novel plating bath formulation thus comprises the conventional copper sulphate, sulphuric acid, sodium chloride, and thiourea with the novel addition of nickel sulphate and iron sulphate.

It is to be noted that, in combination, the particular substrate conditioning steps utilizes, the provision of the intermediate metal layer, and the specific electroplating bath formulation will yield a product that can be successfully subjected to post thermal heat treatment without loss in adhesion strength and with markedly reduced blistering taking place.

DESCRIPTION OF THE DRAWINGS

The process and products of the invention will now be described having reference to the accompanying figures in which.

DESCRIPTION OF THE PREFERRED EMBODIMENT

Figure 1:
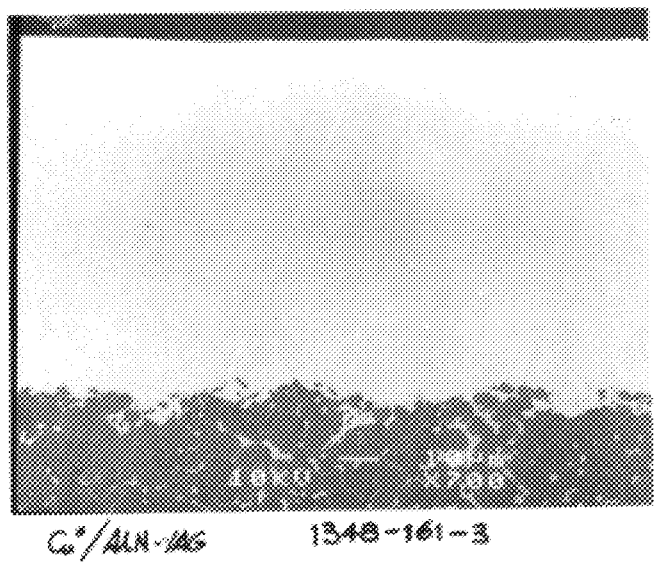
FIG. 1 is a photomicrograph taken at a magnification of 700×, showing a cross-section of the aluminum nitride substrate 10 and the smooth surfaced thick copper film 12 plated thereon.
Figure 2:
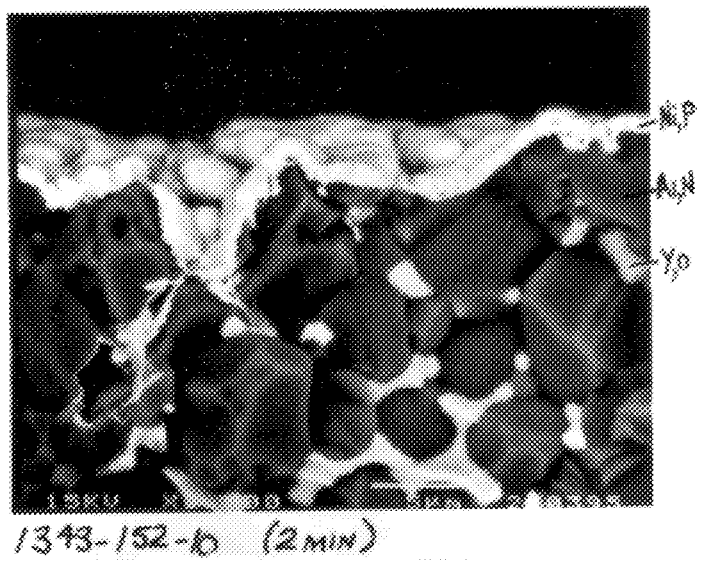
FIG. 2 is a photomicrograph taken at a magnification of 2500× detailing the intermediate electrolessly plated nickel layer 14 on the aluminum nitride substrate 16.
Figure 3:
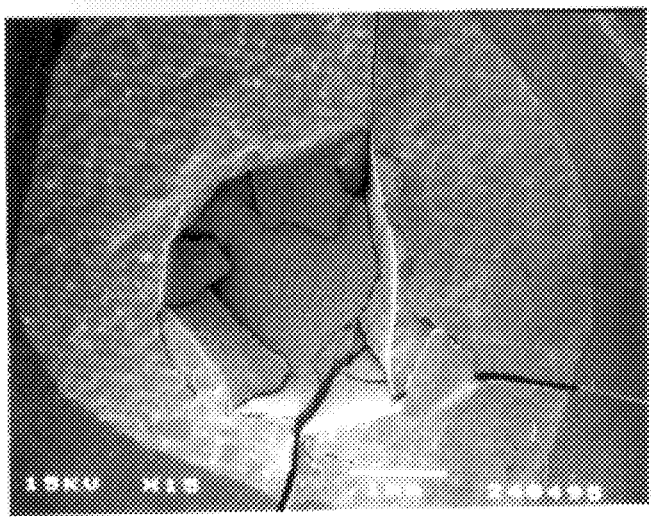
FIG. 3 is a photomicrograph taken at a magnification of 15× depicting the failed portion of the aluminum nitride substrate 18 and showing the intact copper layer 20 still bonded to the undamaged portion of the substrate 18, following the Sebastian pull test. (The Sebastian adherence test is conducted on standard equipment manufactured by Quad Group, Santa Barbara, Calif.)
Figure 4:
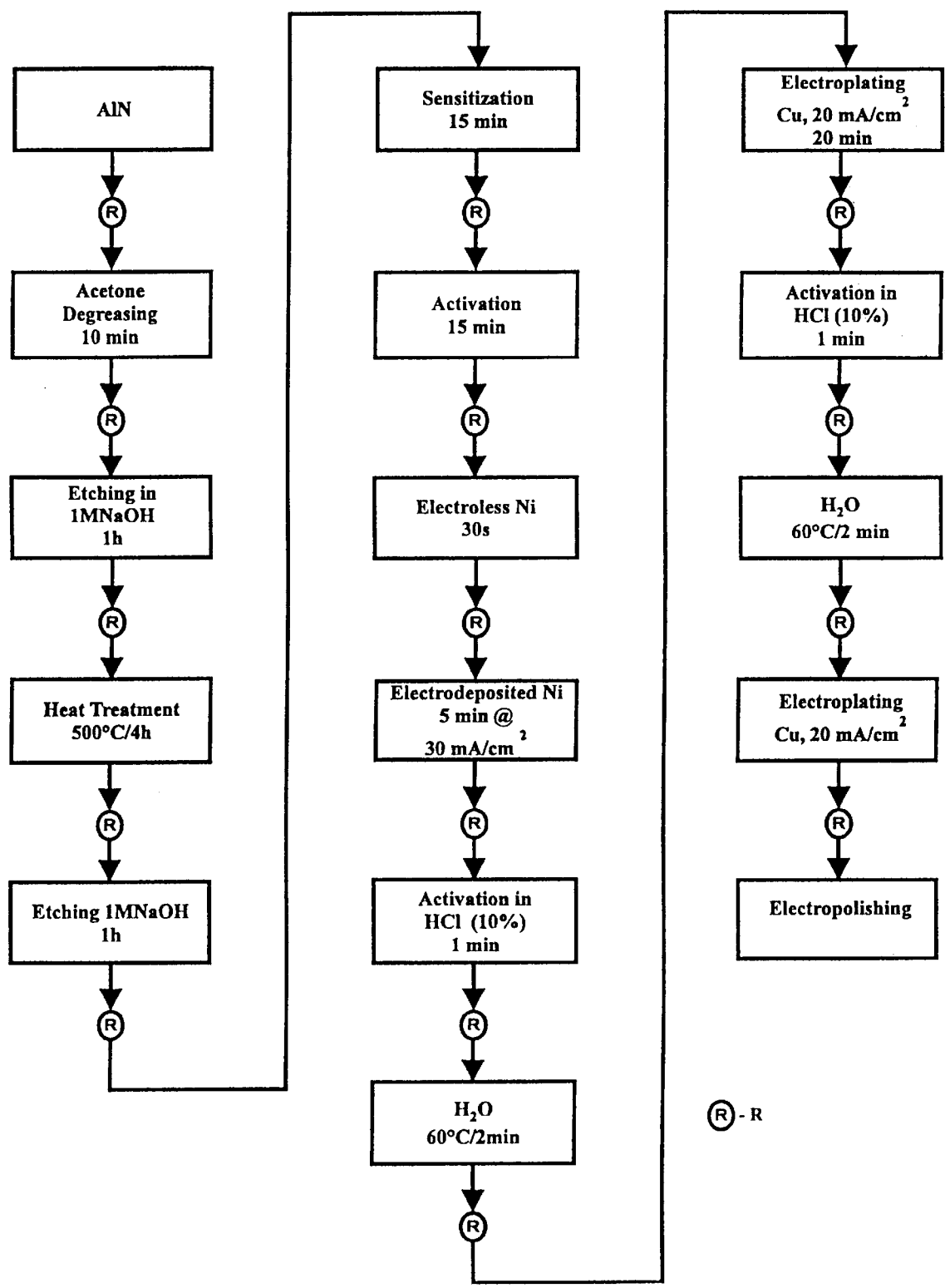
FIG. 4 is a block flow diagram of a preferred embodiment of the present invention.

Suitable ceramic substrates are selected from aluminum nitride, alumina, beryllia, tungsten carbide, silicon carbide or zirconia. The most preferred ceramic substrate is aluminum nitride.

The substrate is first degreased using an organic solvent, exemplary of which is acetone, for about ten minutes. This is followed by a distilled water rinse, as is every step of the process disclosed herein.

Following this cleaning step, the substrate is subjected to an alkaline etch to roughen the substrate surface. The alkaline solution may comprise NaOH or KOH. Typically a 0.5 to 1M aqueous solution of sodium hydroxide is used and the substrate is immersed therein for at least one hour. With an aluminum nitride substrate the soluble complex sodium aluminate is formed which is functional to roughen the surface.

The surface roughed substrate is then subjected to an atmospheric heat treatment to pyrolyze residual organic impurities. Heat treatment is carried out at temperatures ranging from 400° C. to 500° C., for about four hours.

A second alkaline etch is applied on the heat treated substrate, and has been found to be necessary for an operative process. This second etch is functional to remove any alkaline soluble impurites formed during the heat treatment step. The alkaline solution may comprise NaOH, or KOH. Typically a 0.5 to 1M aqueous solution of sodium hydroxide is used and the substrate is immersed therein for at least one hour.

The substrate is then sensitized for electroless deposition by using an acidic aqueous solution of tin (II) chloride, the tin ions being strongly adsorbed onto the substrate surface.

An activation step involving the exposure of the substrate surface to be metallized is carried out using an acidic aqueous palladium (II) chloride solution. The palladium ions are reduced to palladium metal by reaction with the tin ions to thereby form palladium active sites.

Both sensitization and activation steps are well known in the art and several alternative methods may be utilized to create the palladium active sites.

The substrate is then immersed in an acid metal salt electroless plating bath for about 30 seconds at a temperature of 80° C. to electrolessly plate a first metallization layer. The conductive metal which must be platable from an aqueous solution, may be selected from nickel, silver, gold, cobalt, platinum or palladium. A suitable electroless nickel plating solution has the composition given in Table I herebelow. It is to be noted that in the case detailed herein the nickel layer will in actuality be nickel phosphide, as is well known to those skilled in the art. However, an electroless deposit of pure nickel may be obtained using hydrazine in place of the sodium hypophosphite solution. The composition of the electroless plating solution for different platable metals is easily determined by a skilled artisan.

TABLE I

| | |
|---|---|
| $NiSO_4 \cdot 6H_2O$ | 28 g/L |
| $NaCH_3COO$ | 17 g/L |
| $NaH_2PO_2$ | 24 g/L |
| $Pb(CH_3COO)_2$ | 0.0015 g/L |
| adjusted to pH 4.6 with $CH_3COOH$ | |

The metallized substrate is then rinsed and further metallization takes place by electrodepositing a conductive metal or alloy selected from nickel, silver, gold, platinum, cobalt, palladium. For example, the electrodeposition of nickel takes place in a Watts bath having the composition given in Table II at 30 mA/cm$^2$.

TABLE II

| | |
|---|---|
| $NiSO_4 \cdot 6H_2O$ | 240 g/L |
| $NiCl_2 \cdot 6H_2O$ | 45 g/L |
| $H_3BO_3$ | 30 g/L |
| T = 60° C. | Current Density = 30 mA/cm$^2$ |

This electrodeposition step may be omitted if the desired metal thickness i. e. in the case of thin-filmed metallized ceramic substrates has been obtained from the electroless deposition step described supra. Again, similarly to the electroless depostion step, the bath composition for alternative metals or alloys is easily determined.

Following the first electrodeposition step the thin film metallized ceramic substrate is activated with a dilute mineral acid solution, for example HCl not greater than 10%, to remove passivating oxides and in order to subsequently produce a substantially crack and pore free electrodeposited layer. A water wash then follows.

Electrodeposition of a metal or alloy selected from Ni, Cu, Co, Pd, Au, Pt, NiWP, NiMoP, NiWB or NiMoB is then conducted. The plating bath composition contains predetermined amounts of the metal or alloy in aqueous solution, sulphuric acid, sodium chloride, thiourea, nickel sulphate and iron sulphate. A water wash and further activation and electrodeposition steps are carried out until the desired metal layer thickness is obtained.

The product and process of the invention will now be described with reference to the following non-limitative example.

EXAMPLE I

An AlN substrate was degreased in acetone ultrasonically for 10 minutes, and washed with water (40°–50° C.). After washing, the sample was etched in 1M NaOH for 1 h and washed with distilled water (40°–50° C.). The AlN sample was dried, and baked at 500° C. for 4 h. After baking the AlN sample was etched again in 1M NaOH for 1 h and washed with distilled water (40°–50° C.). The substrate was then sensitized in SnCl$_2$/HCl solution for 15 minutes, rinsed with distilled water and activated with PdCl$_2$/HCL solution for 15 minutes. After activation with the Pd-solution, the sample was rinsed with distilled water and the nickel (first metallization) was electrolessly plated from an acidic bath at 80° C. for 30 seconds. The composition of the electroless plating bath was as follows: NiSO$_4$.6H$_2$O:28 g/L; NaCH$_3$COO:17 g/L; NaH$_2$PO2:24 g/L; Pb(CH$_3$COO)$_2$ :0.0015 g/L; and the solution was adjusted to pH 4.6 using CH$_3$COOH. The metallized AlN sample was rinsed and after that Ni was electrodeposited from a Watts bath at 30 mA/cm$^2$. The composition of the Watts bath was as follows: NiSO$_4$.6H$_2$O: 240 g/L; NiCl$_2$. 6H$_2$O: 45 g/L and H$_3$BO$_3$:30 g/L; at a temperature of 60° C. and current density of 30 mA/cm$^2$. After the Ni electrodeposition, the sample was rinsed and then treated with HCl (10%) for 1 minute. After the treatment with HCl the sample was rinsed with water and electrodeposition of copper from the acid bath was carried out. The acid bath had the composition given in Table III given below.

TABLE III

| | |
|---|---|
| $CuSO_4 \cdot 5H_2O$ | 200 g/L |
| $H_2SO_4$ | 20 g/L |
| NaCl | 0.5 g/L |
| Thiourea | 0.01 g/L |
| $NiSO_4 \cdot 6H_2O$ | 0.1 g/L |
| $FeSO_4 \cdot 6H_2O$ | 0.1 g/L |
| T = 23 +/− 2° C. | Current Density = 20 mA/cm$^2$ |

After 20 min of copper electrodeposition the sample was again treated with 10% HCl for 1 min, washed with water and then electrodeposition of copper up to the desired thickness was continued. In order to obtain a smooth surface, following electrodeposition, the sample was electropolished galvanostatically in H$_3$PO$_4$ at 0.35 A/cm$^2$. The electropolished sample was water washed and then dried. A pattern was screen printed on the metallized AlN substrate and the copper was then etched with FeCl$_3$ solution. After the resist removal, with a suitable solution, such as acetone or sodium hydroxide, the adhesion was determined using the Sebastian pull test. A blistering test was carried out in a programmed laboratory oven at 325° C. under N$_2$ for 30 min. Adhesion strength of the "as plated" sample (50–60 microns thick) was found to be between 50 and 70 MPa. Furthermore, the blistering test demonstrated that blisters did not appear and the adhesion did not change significantly.

We claim:

1. A process for the production of a metalized ceramic substrate which comprises:
    a) cleaning said ceramic substrate with an organic solvent;
    b) etching said cleaned substrate at ambient temperature with an aqueous alkaline solution;
    c) rinsing said etched substrate in water to remove substantially all the alkaline solution;
    d) heat treating said etched substrate of step c) at a temperature effective to pyrolyse any residual organic solvent;
    e) subjecting said heat treated substrate to a second alkaline etch at ambient temperature to remove any alkaline soluble impurities formed during said heat treatment step;
    f) rinsing said etched substrate of step e) in water to remove substantially all the alkaline solution;
    g) electrolessly depositing a metal selected from the group consisting of nickel, silver, gold, cobalt, palladium and platinum on the substrate of step f) to form an intermediate thin metal layer; and
    h) electrodepositing a metal from an aqueous solution, said metal selected from the group consisting of nickel, copper, silver, gold, cobalt, palladiuim and platinum, or an alloy thereof with an element selected from the group consisting of phosphorous, boron, tungsten and molybdenum upon said intermediate thin metal layer.

2. A process as claimed in claim 1 further comprises sensitizing the substrate of step f) and forming palladium active sites on the sensitized substrate prior to electroless deposition of step g).

3. A process as claimed in claim 2, between steps g) and h) further comprises electrodepositing the same metal electrolessly deposited in step g) onto the metal deposited in step g).

4. A process as set forth in claim 3 wherein said metal electrodeposited between steps g) and h) is selected from the group consisting of silver, gold, platinum, cobalt and palladium.

5. A process as set forth in claim 3 wherein said metal electrodeposited between steps g) and h) is nickel.

6. A process as set forth in claim 1 wherein said ceramic substrate is selected from the group consisting of aluminum nitride, alumina, beryllia, tungsten carbide, silicon carbide and zirconia.

7. A process as claimed in claim 6 wherein the intermediate metallized layer is nickel and the outer metallized layer is copper electroplated from a bath comprising an aqueous solution of copper sulphate, sulphuric acid, sodium chloride, thiourea and about 0.1 g/L of nickel sulphate and iron sulphate.

8. A process as set forth in claim 1 wherein said ceramic substrate is aluminum nitride.

9. A process as set forth in claim 8 wherein said intermediate layer is nickel.

10. A process as set forth in claim 8 wherein said intermediate layer is nickel having a thickness of about one micron and said electrodeposited metal from step h) is copper having a thickness in the range of about 10 to 200 microns.

11. A process as set forth in claim 10 wherein said electrodeposition of step h) is undertaken in an electroplating bath having a composition comprising: an aqueous solution of copper sulphate, sulphuric acid, sodium chloride, thiourea, and about 0.1 g/L of nickel sulphate and iron sulphate.

12. A process as set forth in claim 1 wherein said electrodeposited metal from step (h) is copper.

13. A process as set forth in claim 1, further comprises polishing the electrodeposited metal of step h).

14. A method for conditioning a ceramic substrate prior to metal deposition thereon which comprises: cleaning said ceramic substrate with an organic solvent; etching said cleaned substrate at ambient temperature using an aqueous alkaline solution; rinsing said etched substrate in water to remove substantially all the alkaline solution; heat treating said etched substrate at a temperature effective to pyrolyse any residual organic impurities; subjecting said heat treated substrate to a second alkaline etch at ambient temperature to remove any alkaline soluble impurities formed during said heat treatment step; and rinsing said etched substrate from the second alkaline etch in water to remove substantially all the alkaline solution.

15. A method as set forth in claim 14 wherein said ceramic substrate is selected from the group consisting of aluminum nitride, alumina, beryllia, tungsten carbide, silicon carbide or zirconia.

16. A method as set forth in claim 14 wherein said ceramic substrate comprises aluminum nitride.

17. A method for producing a thin-filmed metallized ceramic substrate which comprises: cleaning said ceramic substrate with an organic solvent; etching said cleaned substrate at ambient temperature with an aqueous alkaline solution; rinsing said etched substrate in water to remove substantially all the alkaline solution. Heat treating said etched substrate at a temperature effective to pyrolyse any residual organic impurities; subjecting said heat treated substrate to a second alkaline etch at ambient temperature to remove any alkaline soluble impurities formed during said heat treatment step; sensitizing the subjected substrate for electroless deposition; forming palladium active sites on said sensitized substrate; electrolessly depositing a metal selected from the group consisting of nickel, silver, gold, copper, cobalt, platinum and palladium on the formed substrate; and electrolytically depositing a metal selected from the group consisting of nickel, silver, gold, copper cobalt, palladium and platinum or an alloy thereof with an element selected from the group consisting of phosphorus, boron, tungsten or molybdenum on the electroless substrate to thereby provide a thin-filmed metallized ceramic substrate.

18. A method as set forth in claim 17 wherein said ceramic substrate is selected from the group consisting of aluminum nitride, alumina, beryllia tungsten carbide, silicon carbide and zirconia.

19. A method as set forth in claim 17 wherein said ceramic substrate is aluminum nitride.

20. A method as set forth in claim 19 wherein said ceramic substrate is aluminum nitride and said electroless and eletrolytically deposited metals comprise nickel, cobalt, silver or copper.

* * * * *